(12) United States Patent
Uematsu et al.

(10) Patent No.: US 12,119,800 B2
(45) Date of Patent: Oct. 15, 2024

(54) SIGNAL TRANSMISSION CIRCUIT AND SIGNAL TRANSMISSION SYSTEM

(71) Applicant: HITACHI ASTEMO, LTD., Hitachinaka (JP)

(72) Inventors: Yutaka Uematsu, Tokyo (JP); Hideyuki Sakamoto, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 456 days.

(21) Appl. No.: 17/633,123

(22) PCT Filed: May 11, 2020

(86) PCT No.: PCT/JP2020/018882
§ 371 (c)(1),
(2) Date: Feb. 4, 2022

(87) PCT Pub. No.: WO2021/024569
PCT Pub. Date: Feb. 11, 2021

(65) Prior Publication Data
US 2022/0278665 A1 Sep. 1, 2022

(30) Foreign Application Priority Data
Aug. 7, 2019 (JP) .................................. 2019-145778

(51) Int. Cl.
*H03H 7/01* (2006.01)
*B60R 16/023* (2006.01)
*H04B 3/02* (2006.01)

(52) U.S. Cl.
CPC .......... *H03H 7/0153* (2013.01); *B60R 16/023* (2013.01); *H04B 3/02* (2013.01)

(58) Field of Classification Search
CPC ............................... H04B 3/02; H03H 7/0153
(Continued)

(56) References Cited

U.S. PATENT DOCUMENTS

| 5,486,800 A * | 1/1996 | Davenport | ........... H03H 9/6483 333/195 |
| 2015/0303951 A1 * | 10/2015 | Zhou | ....................... H04J 14/04 370/280 |

(Continued)

FOREIGN PATENT DOCUMENTS

| JP | H05-87913 A | 4/1993 |
| JP | 2019-41385 A | 3/2019 |

OTHER PUBLICATIONS

International Search Report with English translation and Written Opinion issued in corresponding application No. PCT/JP2020/018882 dated Jul. 28, 2020.

*Primary Examiner* — Rakesh B Patel
(74) *Attorney, Agent, or Firm* — Foley & Lardner LLP

(57) ABSTRACT

A signal transmission circuit includes a common frequency filter configured to filter a signal centering on a common frequency that is an anti-resonance frequency; a first frequency filter configured to filter a signal centering on a first frequency that is an anti-resonance frequency; a second frequency filter configured to filter a signal centering on a second frequency that is an anti-resonance frequency; a first route connected to a first signal wiring line configured to transmit a digital signal; and a second route connected to a second signal wiring line configured to transmit a digital signal. The first route has the common frequency filter connected to a power supply circuit, and the first frequency filter disposed between the common frequency filter and the first signal wiring line and connected in series to the common frequency filter, the second route has the common frequency filter, and the second frequency filter disposed between the common frequency filter and the second signal wiring line and connected in series to the common frequency filter, and both the first frequency and the second frequency are equal to or higher than the common frequency.

9 Claims, 11 Drawing Sheets

(58) Field of Classification Search
USPC .......................... 333/125, 126, 172, 174, 175
See application file for complete search history.

(56) References Cited

U.S. PATENT DOCUMENTS

2019/0056444 A1  2/2019  Dragoi et al.
2019/0068385 A1  2/2019  Gardner et al.

* cited by examiner

FIG. 9

|  | EXAMPLE 1 | EXAMPLE 2 | EXAMPLE 3 | EXAMPLE 4 |
|---|---|---|---|---|
| FOR LOW FREQUENCY | 500mA | 500mA | 1A | 1A |
| FOR INTERMEDIATE FREQUENCY | - | 250mA | - | 500mA |
| FOR RADIO FREQUENCY | 250mA | 250mA | 250mA | 250mA |

SIGNAL TRANSMISSION CIRCUIT AND SIGNAL TRANSMISSION SYSTEM

TECHNICAL FIELD

The present invention relates to a signal transmission circuit and a signal transmission system.

BACKGROUND ART

In recent years, in signal transmission between devices mounted on a vehicle, in order to reduce weight and cost of a wire harness, a transmission method called a power over coax (PoC), which realizes signal transmission and power supply with a single coaxial cable having light weight and low cost has been adopted. In the PoC, a signal and a power supply are separated using a filter circuit called a PoC filter, the filter circuit being mounted on each of a transmission-side device and a reception-side device, so that it is possible to cause the signal and the power supply to flow in a manner superimposed on a single coaxial cable without adversely affecting signal quality.

PTL 1 discloses a radio frequency power superimposition system configured to superimpose and transmit AC power and a radio frequency signal between first and second devices, the system including: a first removal unit configured to remove radio frequency noise from the AC power; a second removal unit configured to remove low frequency noise from the radio frequency signal from the first device; a superimposition transmission unit configured to superimpose and transmit the radio frequency signal from which the low frequency noise has been removed by the second removal unit on the AC power from which the radio frequency noise has been removed by the first removal unit; a third removal unit configured to remove the radio frequency noise from the signal superimposed and transmitted by the superimposition transmission unit when an AC current is supplied to the first and second devices; and a fourth removal unit configured to remove low frequency noise from the signal superimposed and transmitted by the superimposition transmission unit when the radio frequency signal is supplied to the second device.

CITATION LIST

Patent Literature

PTL 1: JP H05-87913 A

SUMMARY OF INVENTION

Technical Problem

In the invention described in PTL 1, there is room for improvement in order to reduce cost in communication of a plurality of channels.

Solution to Problem

A signal transmission circuit according to a first aspect of the present invention includes: a common frequency filter configured to filter a signal centering on a common frequency that is an anti-resonance frequency; a first frequency filter configured to filter a signal centering on a first frequency that is an anti-resonance frequency; a second frequency filter configured to filter a signal centering on a second frequency that is an anti-resonance frequency; a first route connected to a first signal wiring line configured to transmit a digital signal; and a second route connected to a second signal wiring line configured to transmit a digital signal, wherein the first route has the common frequency filter connected to a power supply circuit, and the first frequency filter disposed between the common frequency filter and the first signal wiring line and connected in series to the common frequency filter, the second route has the common frequency filter, and the second frequency filter disposed between the common frequency filter and the second signal wiring line and connected in series to the common frequency filter, and both the first frequency and the second frequency are equal to or higher than the common frequency.

A signal transmission system according to a second aspect of the present invention is a signal transmission system configured to connect a camera and an ECU module by a plurality of signal wiring lines including the first signal wiring line and the second signal wiring line, wherein a plurality of cameras are connected to the ECU module, and a configuration of a PoC filter configuring an inside of the ECU module has the configuration described above.

Advantageous Effects of Invention

According to the present invention, the number of components can be reduced in communication of a plurality of channels. Problems, configurations, and effects other than those described above will be clarified by description of embodiments below.

BRIEF DESCRIPTION OF DRAWINGS

FIG. 9 is a diagram showing rated current values in the fourth embodiment.

DESCRIPTION OF EMBODIMENTS

Figure 1:
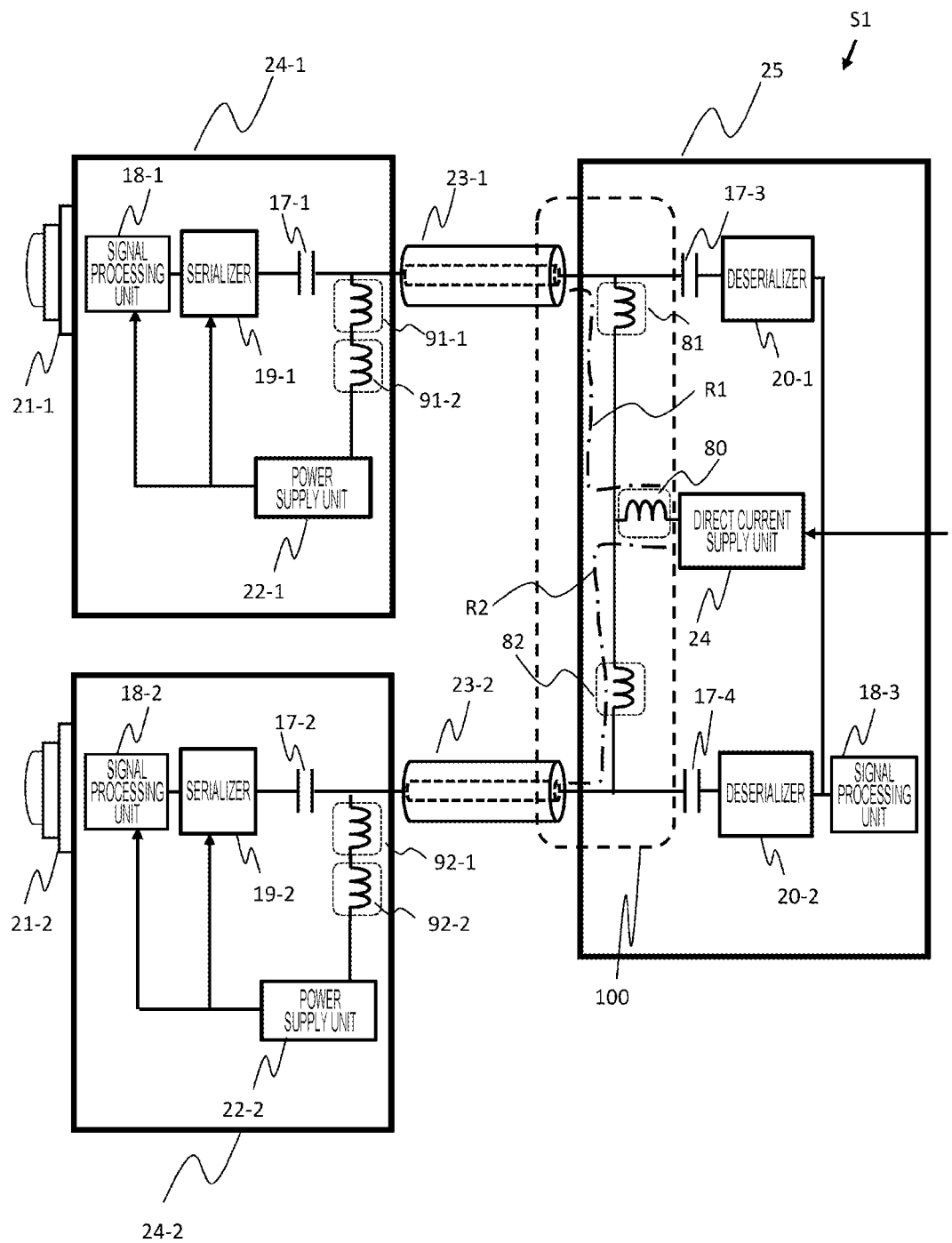
FIG. 1 is a diagram showing a signal transmission system.

Hereinafter, embodiments of the present invention will be described with reference to the drawings. Examples are exemplification for describing the present invention, and are omitted and simplified as appropriate for clarity of description. The present invention can be carried out in various other forms. Unless otherwise specified, each component may be singular or plural. In order to facilitate understanding of the invention, positions, sizes, shapes, ranges, and the like of the respective components shown in the drawings may not represent actual positions, sizes, shapes, ranges, and the like. Therefore, the present invention is not necessarily limited to the positions, sizes, shapes, ranges, and the like disclosed in the drawings. In a case where there is a plurality of components having the same or similar functions, the same reference signs may be attached with different subscripts for description. In addition, in a case where it is not necessary to distinguish the plurality of components, description may be given by omitting the subscripts.

First Embodiment

Hereinafter, a first embodiment of a signal transmission circuit according to the present invention will be described with reference to FIGS. 1 to 4.

FIG. 1 is a diagram showing a signal transmission system S1 including a signal transmission circuit L1 in the present embodiment. The signal transmission system S1 includes an ECU module 25, a first camera 24-1, and a second camera 24-2. The ECU module 25 and the first camera 24-1 are connected by a first signal wiring line 23-1, and the ECU module 25 and the second camera 24-2 are connected by a second signal wiring line 23-2. The first signal wiring line 23-1 and the second signal wiring line 23-2 are, for example, coaxial cables. Hereinafter, the first cable 23-1 and the second cable 23-2 are collectively referred to as a "signal wiring line" 23. Hereinafter, the first camera 24-1 and the second camera 24-2 are collectively referred to as a "sensor module" 24.

The ECU module 25 performs both signal transmission and power supply to the camera 24 via the signal wiring line 23. Since configurations of the first camera 24-1 and the second camera 24-2 are substantially the same, the configuration of the first camera 24-1 will be mainly described below. Note that, in the following, a description will be given on the assumption that signal transmission from the sensor module 24 to the ECU module 25 is performed, but conversely, signal transmission from the ECU module 25 to the camera 24 may be performed, or bidirectional communication may be performed. Since the ECU module 25 has two communication routes of the first signal wiring line 23-1 and the second signal wiring line 23-2, it can also be said that the ECU module 25 in the present embodiment performs two-channel communication.

The camera 24 is a transmission source of a signal transmitted in the signal transmission system S1, and is used in combination with various instruments and devices. The first camera 24-1 includes a camera 21-1, and transmits an image signal based on image information acquired by the camera 21-1 to the ECU module 25 via the signal wiring line 23. The first camera 24-1 includes a signal processing unit 18-1, a serializer 19-1, a capacitor 17-1, a first-device first frequency filter 91-1, a first-device second frequency filter 91-2, and a power supply unit 22-1.

The signal processing unit 18-1 outputs information of the captured image obtained by the camera 21-1 capturing the image to the serializer 19-1 as a parallel signal. The serializer 19-1 converts the parallel signal output from the signal processing unit 18-1 into a serial signal and outputs the serial signal to the first signal wiring line 23-1 via the capacitor 171. As a result, the signal is transmitted from the first camera 24-1 to the ECU module 25 via the first signal wiring line 23-1.

The capacitor 17-1 is connected between the first signal wiring line 23-1 and the serializer 19-1, and functions as a high-pass filter configured to transmit the signal output from the serializer 19-1 and block a direct current supplied from the ECU module 25 via the first signal wiring line 23-1. The first-device first frequency filter 91-1 and the first-device second frequency filter 91-2 are connected between the first signal wiring line 23-1 and the power supply unit 22-1. The first-device first frequency filter 91-1 and the first-device second frequency filter 91-2 function as a low pass filter (PoC filter) configured to transmit the direct current supplied from the ECU module 25 via the first signal wiring line 23-1 and block the signal output from the serializer 19-1. The power supply unit 22-1 receives the direct current supplied from the ECU module 25 and passed through the first-device first frequency filter 91-1 and the first-device second frequency filter 91-2, and supplies power to the signal processing unit 18-1 and the serializer 19-1 using this direct current.

The second camera 24-2 includes a signal processing unit 18-2, a serializer 19-2, a capacitor 17-2, a second-device first frequency filter 92-1, a second-device second frequency filter 92-2, and a power supply unit 22-2. Functions of the signal processing unit 18-2, the serializer 19-2, and the power supply unit 22-2 are the same as those of the signal processing unit 18-1, the serializer 19-1, and the power supply unit 22-1 of the first camera 24-1, respectively. Functions of the capacitor 17-2, the second-device first frequency filter 92-1, and the second-device second frequency filter 92-2 are the same as those of the capacitor 17-1, the first-device first frequency filter 91-1, and the first-device second frequency filter 91-2 of the first camera 24-1, respectively. However, physical property values of the capacitor 17-2, the second-device first frequency filter 92-1, and the second-device second frequency filter 92-2 may not be the same as those of the capacitor 17-1, the first-device first frequency filter 91-1, and the first-device second frequency filter 91-2 of the first camera 24-1.

The ECU module 25 functions as a signal transmission circuit configured to transmit a signal to and from the camera 24 in the signal transmission system S1, receives the signal transmitted from the camera 24, and performs various types of processing and control. The ECU module 25 is, for example, an electronic control unit (ECU) configured to perform image processing for automatic driving. A signal processing unit 18-3 thereof receives an image signal transmitted from the camera 24 installed in a vehicle, and performs various types of arithmetic processing related to automatic driving of the vehicle on the basis of the received image signal. The ECU module 25 includes the signal processing unit 18-3, a first deserializer 20-1, a second deserializer 20-2, a capacitor 17-3, a capacitor 17-4, a common frequency filter 80, a first frequency filter 81, a second frequency filter 82, and a direct current supply unit 26. Hereinafter, the first deserializer 20-1 and the second deserializer 20-2 are collectively referred to as a "deserializer" 20.

A serial signal transmitted from the first camera 24-1 to the ECU module 25 via the first signal wiring line 23-1 is input to the first deserializer 20-1 via the capacitor 17-3. A serial signal transmitted from the second camera 24-2 to the ECU module 25 via the second signal wiring line 23-2 is input to the second deserializer 20-2 via the capacitor 17-4. The deserializer 20 receives the input serial signal, converts the serial signal into a parallel signal, and outputs the parallel signal to the signal processing unit 18-3. The deserializer 20 has a known equalizer function of compensating for attenuation of the signal caused by the signal wiring line 23 by adjusting a waveform of the received signal in accordance with a frequency characteristic of the signal wiring line 23, and can accurately detect the signal received from the camera 24 by using the equalizer function.

The signal processing unit 18-3 performs various types of signal processing based on the signal received by the deserializer 20.

The direct current supply unit 26 is supplied with power from a battery (not shown) and generates an appropriate voltage to provide a direct current.

The capacitor 17-3 and the capacitor 17-4 are connected between the signal wiring line 23 and the deserializer 20, and transmit the signal transmitted from the camera 24 via the signal wiring line 23. Furthermore, the capacitor 17-3 and the capacitor 17-4 function as a high-pass filter configured to block the direct current output from the direct current supply unit 26. The common frequency filter 80, the first frequency filter 81, and the second frequency filter 82 are connected between the signal wiring line 23 and the direct current supply unit 26, and transmit a direct current Id output from the direct current supply unit 26. Furthermore, the common frequency filter 80, the first frequency filter 81, and the second frequency filter 82 function as a low-pass filter (PoC filter) configured to block the signal transmitted from the camera 24 via the signal wiring line 23. Hereinafter, a range of a broken line shown in FIG. 1 is referred to as a PoC filter unit 100. Further, hereinafter, the PoC filter unit 100 is also referred to as a "signal transmission circuit".

The ECU module 25 includes a first route R1 and a second route R2 indicated by alternate long and short dash line in FIG. 1. Both the first route R1 and the second route R2 are routes of electric signals, and are conceptual. The first route R1 connects the camera 24 and the first signal wiring line 23-1, and the first route R1 includes the common frequency filter 80 and the first frequency filter 81. The second route R2 connects the camera 24 and the second signal wiring line 23-2, and the second route R2 includes the common frequency filter 80 and the second frequency filter 82. That is, the common frequency filter 80 is included in both the first route R1 and the second route R2. Before describing the details of the first frequency filter 81, the second frequency filter 82, and the direct current supply unit 26, a principle of a known PoC filter will be described.

(Principle of PoC Filter)

Figure 2:
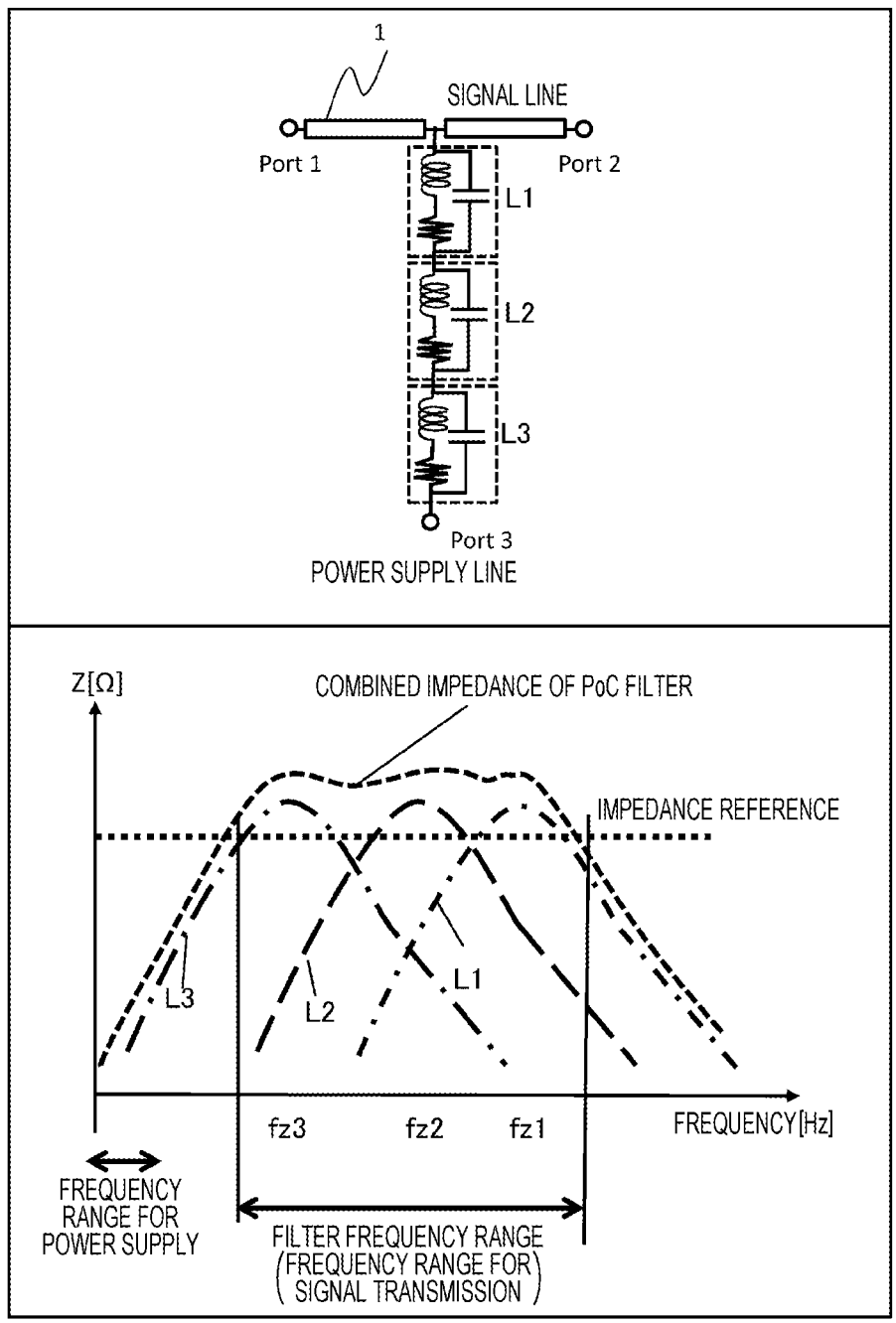
FIG. 2 is a diagram for describing a principle of a PoC filter.

FIG. 2 is a diagram for describing a principle of the PoC filter. An upper part of FIG. 2 shows a circuit configuration of a general PoC filter, and a lower part of FIG. 2 shows impedance of the PoC filter. As shown in the upper part of FIG. 2, an equivalent circuit of the frequency filter is not a simple inductance, but is expressed by an equivalent circuit with a resistance component in series to the inductance and a parasitic capacitance component in parallel with the inductance. That is, the frequency filter is a parallel LC circuit, and has a mountain-shaped impedance profile that takes a maximum value of impedance at an anti-resonance frequency determined by L and C. Note that, in FIG. 1, all configurations denoted by reference signs 91-1, 91-2, 92-1, 92-2, 80, 81, and 82 are the frequency filters.

The PoC filter has a role of preventing energy from being transmitted to the power supply line side by inserting components each having a sufficiently high impedance with respect to the signal line at connection points with the power supply line. As a function of the filters, it is necessary to set a frequency range in which the energy of the signal exists, that is, a signal transmission frequency range so that a certain impedance or more is obtained. On the other hand, since the impedance of a single frequency filter cannot cover a wide frequency range, the filter frequency range is expanded by using a plurality of components having different anti-resonance frequencies. The lower part of FIG. 2 shows an example in which the filter frequency range is expanded by combining three frequency filters.

In the present embodiment, each of the frequency filters is also referred to as an "inductance component". In FIG. 2, the impedance values at the anti-resonance frequencies of inductance components L1 to L3 are substantially the same only for convenience of drawing, and the impedance values at the anti-resonance frequencies may be different. In FIG. 2, the anti-resonance frequencies of the inductance components L1 to L3 are referred to as fz1 to fz3, respectively.

In the present embodiment, a fact that the anti-resonance frequency of a certain inductance component is higher than the anti-resonance frequency of other inductance components is also expressed as the following four. That is, it is expressed as a "radio frequency filter", a "filter for radio frequency", "a signal transmission characteristic of radio frequency is low", and "a signal transmission characteristic of low frequency is high".

As shown in FIG. 2, a frequency filter L1 having a highest anti-resonance frequency is provided as a PoC filter component for radio frequency at a connection point with a signal line, a frequency filter for intermediate frequency L2 is subsequently connected, and a frequency filter for low frequency L3 is connected in a final stage. With such connection, the impedance of the filter unit is kept high in the frequency range of the signal passing through the signal line, and a function of preventing signal energy leakage is achieved.

(Appearance of PoC Filter Unit)

Figure 3:
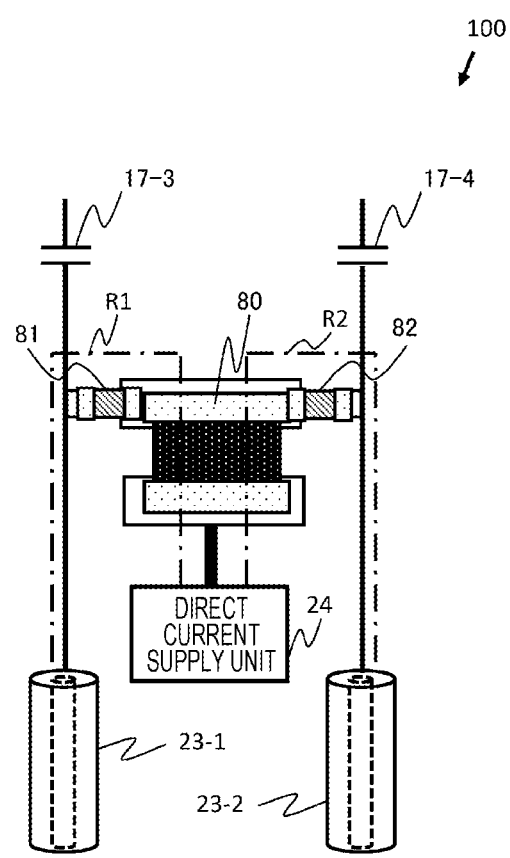
FIG. 3 is a diagram showing a PoC filter unit in a first embodiment.

FIG. 3 is a diagram showing an appearance of the PoC filter unit 100. However, in FIG. 3, in order to clearly show a connection relationship between the PoC filter unit 100 and the other configuration of the ECU module 25, the configuration other than the PoC filter unit 100 is also shown. Also in FIG. 3, the first route R1 and the second route R2, which are conceptual routes of electric signals, are indicated by alternate long and short dash lines. The common frequency filter 80 commonly included in the first route R1 and the second route R2 is a low frequency filter configured to filter a low frequency, and has a larger volume than that of each of the first frequency filter 81 and the second frequency filter 82 due to its physical characteristics. Reference sign 4-1 denotes an in-substrate dielectric layer. However, a description of the in-substrate dielectric layer will be omitted below.

Hereinafter, an anti-resonance frequency of the common frequency filter 80 is referred to as a common frequency fc, an anti-resonance frequency of the first frequency filter 81 is referred to as a first frequency f1, and an anti-resonance frequency of the second frequency filter 82 is referred to as a second frequency f2. The first frequency filter 81 and the second frequency filter 82 are radio frequency filters each having an anti-resonance frequency higher than that of the common frequency filter 80. That is, fc<f1 and fc<f2 are established.

In the present embodiment, the common frequency filter 80 is shared by the first route R1 and the second route R2, so that the number of components can be reduced. Furthermore, since the common frequency filter 80 shared by the first route R1 and the second route R2 is a filter for low frequency and has a relatively large volume, an effect of downsizing the device including the ECU module 25 by reducing the number of common frequency filters 80 by one is large.

Comparative Example

Figure 4:
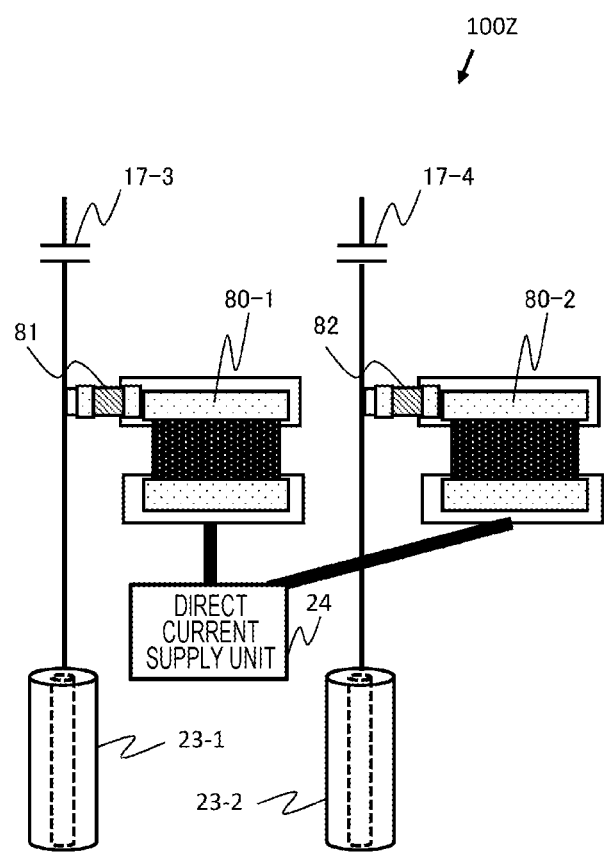
FIG. 4 is a diagram showing a PoC filter unit according to a conventional technique as a comparative example.

FIG. 4 is a diagram showing an appearance of a PoC filter unit 100Z according to a conventional technique as a comparative example. In FIG. 4, in order to facilitate comparison with FIG. 3, which shows the configuration in the present embodiment, the same reference signs are used to show a configuration for convenience. As shown in FIG. 4, the PoC filter unit 100Z of the comparative example includes two filters for low frequency as indicated by reference signs 80-1 and 80-2. As shown in FIG. 4, in the comparative example, since the filter for low frequency is required for each signal wiring line, the number of components is larger and the volume is larger than those of the present embodiment. That is, in the comparative example, the cost increases and the size of the device also increases.

According to the first embodiment described above, the following actions and effects can be obtained.

(1) The PoC filter unit 100 that is a signal transmission circuit includes the common frequency filter 80 configured to filter a signal centering on the common frequency fc that is an anti-resonance frequency, the first frequency filter 81 configured to filter a signal centering on the first frequency f1 that is an anti-resonance frequency, the second frequency filter 82 configured to filter a signal centering on the second frequency f2 that is an anti-resonance frequency, the first route R1 connected to the first signal wiring line 23-1 configured to transmit a digital signal, and the second route R2 connected to the second signal wiring line 23-2 configured to transmit a digital signal. The first route R1 has the common frequency filter 80 connected to the direct current supply unit 26 that is a power supply circuit, and the first frequency filter 81 disposed between the common frequency filter 80 and the first signal wiring line 23-1 and connected in series to the common frequency filter 80. The second route R2 has the common frequency filter 80, and the second frequency filter 82 disposed between the common frequency filter 80 and the second signal wiring line 23-2 and connected in series to common frequency filter 80. Therefore, the number of components can be reduced in the communication of the plurality of channels, so that advantages of cost reduction and downsizing can be obtained.

(2) The common frequency filter 80 has an anti-resonance frequency smaller than those of the first frequency filter 81 and the second frequency filter 82, and thus has a larger volume than those of the first frequency filter 81 and the second frequency filter 82. Therefore, by commonizing the common frequency filter 80 having a large volume in the first route R1 and the second route R2 for reduction, the effect of reducing the volume is large.

(3) The common frequency fc is lower than the first frequency f1 and the second frequency f2.

(4) In a signal transmission system S, the camera 24 and the ECU module 25 are connected by the plurality of signal wiring lines including the first signal wiring line 23-1 and the second signal wiring line 23-2. The plurality of cameras are connected to the ECU module 25, and the configuration of the PoC filter configuring an inside of the ECU module 25 is as described above. Therefore, the number of components of the signal transmission system S can be reduced, so that the cost reduction and the downsizing can be achieved.

First Modification

In the first embodiment described above, the anti-resonance frequency of the common frequency filter 80 is lower than the anti-resonance frequencies of the first frequency filter 81 and the second frequency filter 82. However, the anti-resonance frequency of the common frequency filter 80 may be the same as at least one of the anti-resonance frequencies of the first frequency filter 81 and the second frequency filter 82. That is, the first frequency f1, the second frequency f2, and the common frequency fc may have the same value. However, when one of the first frequency f1 and the second frequency f2 is the same as the common frequency fc, the anti-resonance frequency of the other frequency filter is higher than the common frequency fc.

A condition of the anti-resonance frequencies in the present modification is expressed by mathematical expressions as follows. That is, fc≤f1 and fc≤f2

Second Modification

The anti-resonance frequencies of the first frequency filter 81 and the second frequency filter 82 may be common. Furthermore, the anti-resonance frequency of the common frequency filter 80 may also have a common value. That is, fc=f1=f2 may be established.

Second Embodiment

A second embodiment of a signal transmission circuit according to the present invention will be described with reference to FIG. 5. In the following description, the same components as those of the first embodiment are denoted by the same reference signs, and differences will be mainly described. Points not specifically described are the same as those in the first embodiment. The present embodiment is different from the first embodiment mainly in that the PoC filter has a three-stage configuration.

Figure 5:
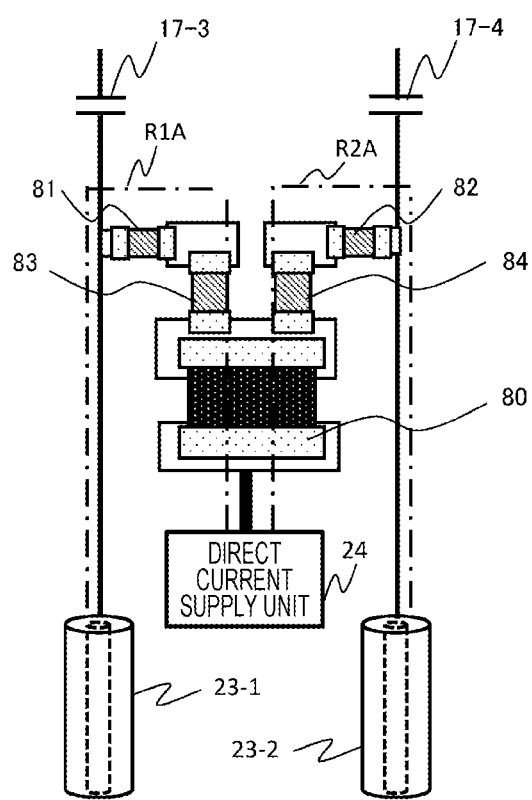
FIG. 5 is a diagram showing a PoC filter unit in a second embodiment.

FIG. 5 is a diagram showing a PoC filter unit 100A in the second embodiment. A first route R1A in the second embodiment further has a third frequency filter 83 in addition to the configuration of the first route R1 in the first embodiment. A second route R2A in the second embodiment further includes a fourth frequency filter 84 in addition to the configuration of the second route R2 in the first embodiment.

That is, each of the first route R1A and the second route R2A has three filters, and only the common frequency filter 80, which is closest to the camera 24, is common. The anti-resonance frequency of each of the filters becomes equal to or higher as approaching the signal wiring line 23 from the camera 24. Here, the anti-resonance frequency of the third frequency filter 83 is represented by f3, and the anti-resonance frequency of the fourth frequency filter 84 is represented by f4. In this case, the anti-resonance frequencies in the first route R1A satisfy a relationship of expression 1, and the anti-resonance frequencies in the second route R2A satisfy a relationship of expression 2.

$$fc \leq f3 \leq f1 \qquad \text{Expression 1}$$

$$fc \leq f4 \leq f2 \qquad \text{Expression 2}$$

That is, the common frequency fc is equal to or less than any of the first frequency f1, the second frequency f2, the third frequency f3, and the fourth frequency f4.

According to the second embodiment described above, the following actions and effects can be obtained.

(5) The first route R1A has, between the first frequency filter f1 and the first signal wiring line 23-1, the third frequency filter 83 configured to filter a signal centering on the third frequency f3 that is an anti-resonance frequency. The second route R2A has, between the second frequency filter f2 and the second signal wiring line 23-2, the fourth frequency filter 84 configured to filter a signal centering on the fourth frequency f4 that is an anti-resonance frequency. The common frequency fc is equal to or less than any of the first frequency f1, the second frequency f2, the third frequency f3, and the fourth frequency f4. Therefore, energy leakage between the signal wiring line 23-1 and the signal wiring line 23-2 is covered up to a lower frequency than in the first embodiment. As a result, for example, sufficient filter performance between the signal wiring lines can be realized even in a transmission system in which encoding as in 8b/10b is not performed on a signal passing through the signal wiring line and a signal component exists up to a relatively low frequency. In general, since a size and cost of a filter component for intermediate frequency are lower than those of the filter for low frequency, component cost and a mounting area can be reduced as a whole as compared with the conventional configuration.

Third Embodiment

A third embodiment of a signal transmission circuit according to the present invention will be described with reference to FIGS. 6 to 7. In the following description, the same components as those of the first embodiment are denoted by the same reference signs, and differences will be mainly described. Points not specifically described are the same as those in the first embodiment. The present embodiment is different from the first embodiment mainly in that a four-channel communication route is provided.

Figure 6:
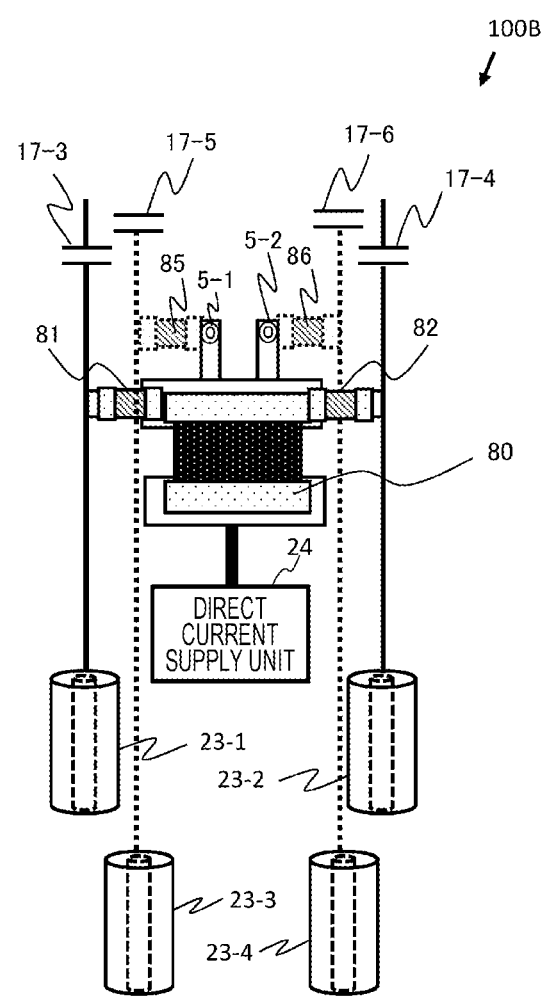
FIG. 6 is a plan view of a PoC filter unit in a third embodiment.
Figure 7:
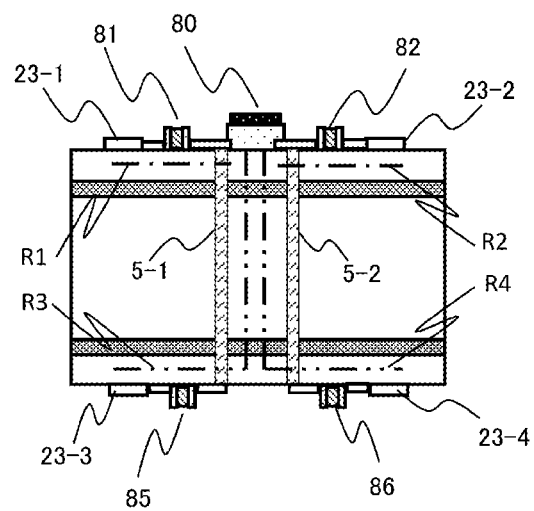
FIG. 7 is a cross-sectional view of the PoC filter unit in the third embodiment.

FIGS. 6 and 7 are diagrams showing a PoC filter unit 100B in the present embodiment. FIG. 6 shows a plan view of the PoC filter unit 100B, and FIG. 7 shows a cross-sectional view of the PoC filter unit 100B. In other words, FIG. 6 is a plan view of a substrate on which the PoC filter unit 100B is disposed, and FIG. 7 is a cross-sectional view of the substrate.

The ECU module 25 communicates with other devices by a third signal wiring line 23-3 and a fourth signal wiring line 23-4 in addition to the first signal wiring line 23-1 and the second signal wiring line 23-2. Moreover, the ECU module 25 has capacitors corresponding to the respective channels, and specifically has a capacitor 17-5 and a capacitor 17-6 in addition to the capacitor 17-3 and the capacitor 17-4 described in the first embodiment. The ECU module 25 further includes a fifth frequency filter 85 and a sixth frequency filter 86. Since the fifth frequency filter 85 and the sixth frequency filter 86 are disposed on a back side of the substrate, they are indicated by broken lines in FIG. 6. The ECU module 25 has in-substrate through holes 5-1, 5-2 configured to connect front and back sides of the substrate.

As shown in FIG. 7, the ECU module 25 has four routes of the first route R1 to a fourth route R4. A third route R3 connects the camera 24 and the third signal wiring line 23-3, and the third route R3 has the common frequency filter 80 and the fifth frequency filter 85. The fourth route R4 connects the camera 24 and the fourth signal wiring line 23-4, and the fourth route R4 has the common frequency filter 80 and the sixth frequency filter 86. Since the first route R1 and the second route R2 are similar to those of the first embodiment, a description thereof will be omitted. The anti-resonance frequencies of the frequency filters have the following relationships. That is, the anti-resonance frequency of any of the first frequency filter 81, the second frequency filter 82, the fifth frequency filter 85, and the sixth frequency filter 86 is equal to or higher than the anti-resonance frequency of the common frequency filter 80. Size relationships among the first frequency filter 81, the second frequency filter 82, the fifth frequency filter 85, and the sixth frequency filter 86 are irrelevant. For example, the anti-resonance frequencies of the first frequency filter 81, the second frequency filter 82, the fifth frequency filter 85, and the sixth frequency filter 86 may be the same, or all the anti-resonance frequencies may be different.

According to the third embodiment described above, the following actions and effects can be obtained.

(6) The PoC filter unit 100B includes the fifth frequency filter 85 configured to filter a signal centering on a fifth frequency f5 that is an anti-resonance frequency, the sixth frequency filter 86 configured to filter a signal centering on a sixth frequency that is an anti-resonance frequency, the third route 23-3 connected to the third signal wiring line configured to transmit a digital signal, and the fourth route 23-4 connected to the fourth signal wiring line configured to transmit a digital signal. The third route R3 has the common frequency filter 80, and the fifth frequency filter 85 disposed between the common frequency filter 80 and the third signal wiring line 23-3 and connected in series to the common frequency filter 80. The fourth route R4 has the common frequency filter 80, and the sixth frequency filter 86 disposed between the common frequency filter 80 and the fourth signal wiring line 23-4 and connected in series to the common frequency filter 80. The common frequency fc is equal to or less than any of the first frequency f1, the second frequency f2, the fifth frequency f5, and the sixth frequency f6. Therefore, the configuration described in the first embodiment can be extended to the four channels.

Note that in the present embodiment, the ECU module 25 has the two channels on each of the front and back surfaces of the substrate, but may have all the four channels on either surface.

Fourth Embodiment

A fourth embodiment of a signal transmission circuit according to the present invention will be described with reference to FIG. 8. In the following description, the same components as those of the second embodiment are denoted by the same reference signs, and differences will be mainly described. Points not specifically described are the same as those in the first embodiment. In the present embodiment, the configuration of the second embodiment is extended to four channels. However, the present embodiment can also be said to be a configuration in which the filters of each of the channels in the third embodiment are changed to a three-stage configuration.

Figure 8:
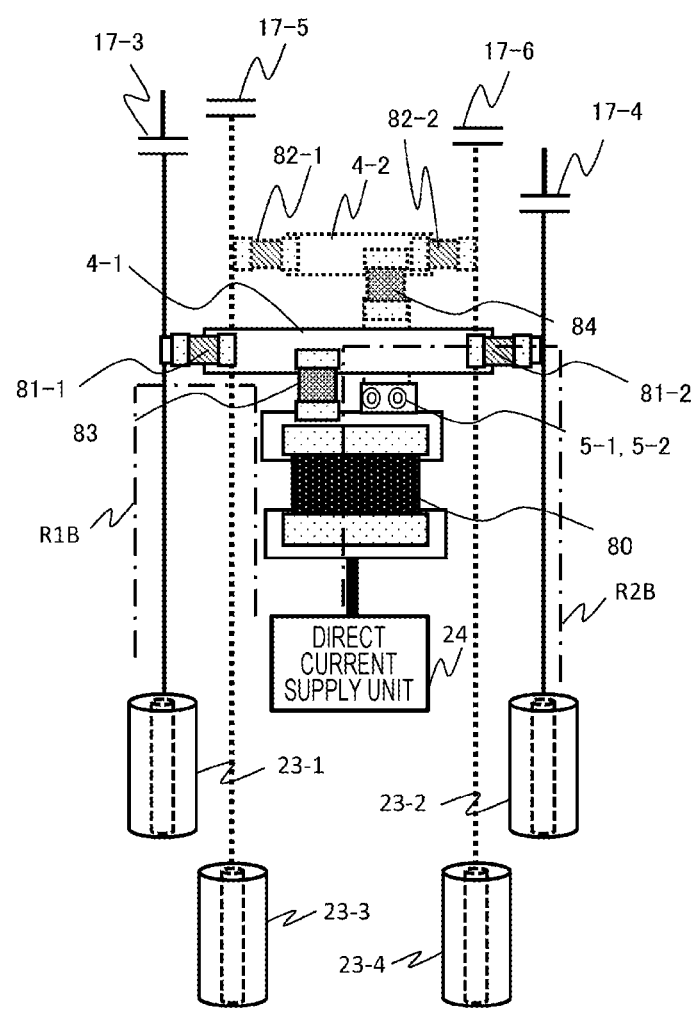
FIG. 8 is a diagram showing a PoC filter unit in a fourth embodiment.

FIG. 8 is a diagram showing a PoC filter unit 100C in the fourth embodiment. As in the third embodiment, the ECU module 25 has the capacitor 17-5, the capacitor 17-6, the third signal wiring line 23-3, and the third signal wiring line 23-3. The ECU module 25 has the common frequency filter 80 for low frequency, the frequency filters for intermediate frequency denoted by reference signs 83 and 84, and frequency filters for radio frequency denoted by reference signs 81-1, 81-2, 82-1, and 82-2. The common frequency filter 80 for low frequency is shared by four routes, and each of the two frequency filters for intermediate frequency is shared by two routes. In the example shown in FIG. 8, the frequency filters denoted by reference signs 84, 82-1, and 82-2 are disposed on the back surface of the substrate.

The frequency filter denoted by reference sign 83 shares a route with the two frequency filters denoted by reference signs 81-1 and 81-2, and thus can be referred to as a "second common frequency filter". The frequency filter denoted by reference sign 84 shares a route with the two frequency filters denoted by reference signs 82-1 and 82-2, and thus can be referred to as a "third common frequency filter".

The anti-resonance frequency of the frequency filter denoted by reference sign 81-1 is denoted by f811, the anti-resonance frequency of the frequency filter denoted by reference sign 82-1 is denoted by f821, the anti-resonance frequency of the frequency filter denoted by reference sign 81-2 is denoted by f812, the anti-resonance frequency of the frequency filter denoted by reference sign 82-2 is denoted by f822, the anti-resonance frequency of the second common frequency filter is denoted by fc2, and the anti-resonance frequency of the frequency filter of the third common frequency filter is denoted by fc3. In this case, relationships represented by the following expressions 3 to 6 are established.

$$fc \leq fc2 \leq f811 \quad \text{Expression 3}$$

$$fc \leq fc2 \leq f812 \quad \text{Expression 4}$$

$$fc \leq fc3 \leq f821 \quad \text{Expression 5}$$

$$fc \leq fc3 \leq f822 \quad \text{Expression 6}$$

Moreover, focusing on the route including the second common frequency filter 83, there is a first route R1B reaching the first signal wiring line 23-1 via the common frequency filter 80, the second common frequency filter 83, and the frequency filter denoted by reference sign 81-1. Further, as a route including the second common frequency filter 83, there is a second route R1B reaching the second signal wiring line 23-2 via the common frequency filter 80, the second common frequency filter 83, and the frequency filter denoted by reference sign 81-2.

According to the fourth embodiment described above, the following actions and effects can be obtained.

(7) The PoC filter unit 100C includes the second common frequency filter 83 configured to filter a signal centering on the second common frequency fc2 that is an anti-resonance frequency. The first route R1B has the second common frequency filter 83 connected in series between the common frequency filter 80 and the frequency filter denoted by reference sign 81-1. The second route R2B has the second common frequency filter 83 connected in series between the common frequency filter 80 and the frequency filter denoted by reference sign 81-2. The second common frequency fc2 is equal to or higher than the common frequency fc. Both of f811 and f812 are equal to or more than fc2. Therefore, it is possible to further reduce the number of components by commonizing up to the second stage among the frequency filters having the three-stage configuration.

Note that, as a method of further reducing energy leakage between signal wiring lines as compared with the present embodiment, the filter for intermediate frequency may also be individualized for each of the wiring lines. Whether the filter for intermediate frequency is commonized by a plurality of routes or individually prepared for each of the routes is determined in a trade-off between performance and cost.

Fifth Embodiment

A fifth embodiment of a signal transmission circuit according to the present invention will be described with reference to FIG. 9. Points not specifically described are the same as those in the first to fourth embodiments. The present embodiment is different from the first to fourth embodiments mainly in that a rated current of a PoC filter component is specified.

A specification value of a rated current is determined for the frequency filters, each of which is a component used for the PoC filter. When a large amount of current flows through each of the frequency filters, heat generation and magnetic saturation occur, and component performance deteriorates. In order to prevent this, a maximum value of an applied current value determined in advance is the rated current. Here, a method of deciding the rated current of each of the components in a case where power supply up to 250 mA is required for each module via the PoC filter is described.

FIG. 9 is a diagram showing rated current values of the filter for low frequency, the filter for intermediate frequency, and the filter for radio frequency in the configurations shown in the first to fourth embodiments. However, in FIG. 9, the "embodiment" is described as an "example" for convenience of drawing. As shown in FIG. 9, it is recommended to use components each having a rated current assuming that a maximum current of the commonized wiring line is simultaneously applied as the filter components. For example, since the component for low frequency is basically commonized into one, a rated current of 250 mA×2=500 mA is required for the two-channel configuration, and a rated current of 250 mA×4=1 A is required for the four-channel configuration.

According to the fifth embodiment described above, the rated current required for each of the filters can be estimated.

Sixth Embodiment

A sixth embodiment of a signal transmission circuit according to the present invention will be described with reference to FIG. 10. In the following description, the same components as those of the first embodiment are denoted by the same reference signs, and differences will be mainly described. Points not specifically described are the same as those in the first embodiment. The present embodiment is different from the first embodiment mainly in that the number of filters varies depending on the route.

Figure 10:
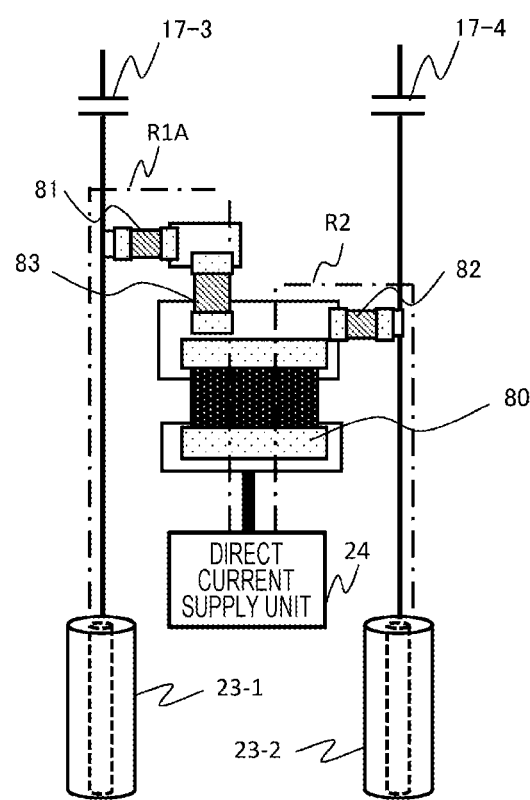
FIG. 10 is a diagram showing a PoC filter unit in a sixth embodiment.

FIG. 10 is a diagram showing a PoC filter unit 100D in the sixth embodiment. In the present embodiment, the first signal wiring line 23-1 transmits a higher-speed signal, and the second signal wiring line 23-2 transmits a lower-speed signal than first signal wiring line 23-1. For example, the first signal wiring line 23-1 transmits 10 Gbps, and the second signal wiring line 23-2 transmits 1 Gbps. Specifically, the configuration corresponds to a configuration in a case where one of the plurality of cameras connected to the ECU module 25 is a high-resolution camera and the other is a low-resolution camera.

In this case, a PoC filter of the route R1A connected to the first signal wiring line 23-1 through which an ultra-high speed signal passes has a three-stage configuration because the PoC filter of a wider frequency range is required. On the other hand, a PoC filter of the route R2 connected to the second signal wiring line 23-2 through which a high-speed signal having a lower frequency than the foregoing passes may have a two-stage configuration. In this configuration, only the low frequency filter is commonized, and the remaining stages are connected in accordance with each required filter frequency.

According to the sixth embodiment described above, the number of stages of the frequency filters can be arbitrarily set while maintaining the actions and effects of the first embodiment.

Seventh Embodiment

A seventh embodiment of a signal transmission circuit according to the present invention will be described with reference to FIG. 11. In the following description, the same components as those of the first embodiment are denoted by the same reference signs, and differences will be mainly described. Points not specifically described are the same as those in the first embodiment. The present embodiment is different from the first embodiment mainly in that a functional safety switch is provided.

When functional safety is considered including a communication system, avoidance of a failure by common cause is an important issue. For example, in the configuration described in the second embodiment, when a short-circuit failure occurs in the power supply circuit that is connected to the one signal line, and is a power supply target of the module, the other signal wiring line cannot be used, either. It is essential to avoid an event leading to a failure of a plurality of modules due to such a single cause from the viewpoint of functional safety design. A configuration for solving this will be described below.

Figure 11:
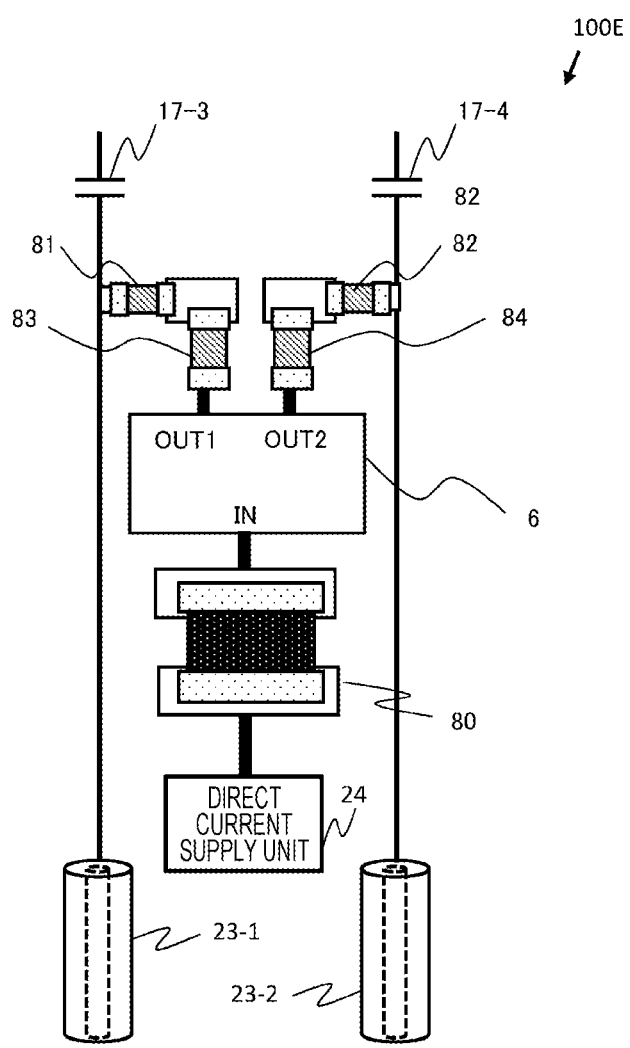
FIG. 11 is a diagram showing a PoC filter unit in a seventh embodiment.

FIG. 11 is a diagram showing a PoC filter unit 100E in the seventh embodiment. In a configuration of FIG. 11, a functional safety switch 6 is inserted between individual filters for intermediate frequency, and a common low-frequency filter. The functional safety switch 6 has a mechanism configured to detect occurrence of a short circuit failure, an overcurrent, or the like ahead of a position connected to an OUT 1 or an OUT 2 and cut off a power supply line on a failed side as necessary. The common frequency filter 80 that is a filter for low frequency is disposed before IN of the functional safety switch 6, and the filters for intermediate frequency and the subsequent filters are individually connected to the position ahead of OUT1 and OUT2.

According to the seventh embodiment described above, the following actions and effects can be obtained.

(8) The common frequency filter 80 has, between the common frequency filter 80 and the other frequency filters connected thereto, the functional safety switch 6 configured to detect overcurrent and a short circuit to ground and protect the power supply. Therefore, when there is no functional safety mechanism on a side of a power supply IC, it is possible to provide a functional safety mechanism by the functional safety switch 6 and to minimize the configuration of the filter components.

While in the seventh embodiment, the functional safety switch 6 is added to the configuration described in the second embodiment, the functional safety switch 6 may be applied to any of the configurations and modifications of the first to sixth embodiments.

In each of the above-described embodiments, the number of signal wiring lines is two or four. However, it suffices that the number of signal wiring lines is two or more, and there is no upper limit on the number of signal wiring lines. Further, the plurality of signal wiring lines may be connected to the same device. For example, in FIG. 1, both the first signal wiring line 23-1 and the second signal wiring line 23-2 may be connected to the first camera 24-1. While in each of the above-described embodiments, the configuration in which the PoC filter according to the present invention is built in the ECU module has been described, the PoC may be built in other than the ECU. A connection destination to which the ECU module is connected by the signal wiring line is not limited to the camera. The ECU module may be connected to another sensor module by a signal wiring line, or may be connected to an arithmetic device not equipped with a sensor.

The above-described embodiments and modifications may be combined. While various embodiments and modifications have been described above, the present invention is not limited to these contents. Other aspects conceivable within the scope of the technical idea of the present invention are also included within the scope of the present invention.

The disclosure of the following priority application is incorporated herein by reference.

Japanese Patent Application No. 2019-145778 (filed on Aug. 7, 2019)

REFERENCE SIGNS LIST 6 functional safety switch
20-1 first deserializer
20-2 second deserializer
22-1 power supply unit
23-1 first signal wiring line
23-2 second signal wiring line
24 direct current supply unit
24 sensor module
24-1 first camera
24-2 second camera
25 ECU module
80 common frequency filter
81 first frequency filter
82 second frequency filter
83 third frequency filter
84 fourth frequency filter
85 fifth frequency filter
86 sixth frequency filter
100, 100A, 100B, 100C, 100D, 100E PoC filter unit
171 capacitor

The invention claimed is:

1. A signal transmission circuit comprising:
a common frequency filter configured to filter a signal centering on a common frequency that is an anti-resonance frequency;
a first frequency filter configured to filter a signal centering on a first frequency that is an anti-resonance frequency;
a second frequency filter configured to filter a signal centering on a second frequency that is an anti-resonance frequency;
a first route connected to a first signal wiring line configured to transmit a first digital signal; and
a second route connected to a second signal wiring line configured to transmit a second digital signal,
wherein
the first route has the common frequency filter connected to a power supply circuit, and the first frequency filter disposed between the common frequency filter and the first signal wiring line and connected in series to the common frequency filter,
the second route has the common frequency filter, and the second frequency filter disposed between the common frequency filter and the second signal wiring line and connected in series to the common frequency filter, and
both the first frequency and the second frequency are equal to or higher than the common frequency.

2. The signal transmission circuit according to claim 1, wherein the common frequency filter has a larger volume than the first frequency filter and the second frequency filter.

3. The signal transmission circuit according to claim 1, wherein the common frequency is lower than the first frequency and the second frequency.

4. The signal transmission circuit according to claim 1, wherein the first frequency, the second frequency, and the common frequency have the same value.

5. The signal transmission circuit according to claim 1, wherein
the first route further has a third frequency filter between the first frequency filter and the first signal wiring line, the third frequency filter configured to filter a signal centering on a third frequency that is an anti-resonance frequency,
the second route further has a fourth frequency filter between the second frequency filter and the second signal wiring line, the fourth frequency filter configured to filter a signal centering on a fourth frequency that is an anti-resonance frequency, and
the common frequency is equal to or less than any of the first frequency, the second frequency, the third frequency, and the fourth frequency.

6. The signal transmission circuit according to claim 1, further comprising:
a third frequency filter configured to filter a signal centering on a third frequency that is an anti-resonance frequency;
a fourth frequency filter configured to filter a signal centering on a fourth frequency that is an anti-resonance frequency;
a third route connected to a third signal wiring line configured to transmit a third digital signal; and
a fourth route connected to a fourth signal wiring line configured to transmit a fourth digital signal,
wherein
the third route has the common frequency filter, and the third frequency filter disposed between the common frequency filter and the third signal wiring line and connected in series to the common frequency filter,
the fourth route has the common frequency filter, and the fourth frequency filter disposed between the common frequency filter and the fourth signal wiring line and connected in series to the common frequency filter, and
the common frequency is lower than any of the first frequency, the second frequency, the third frequency, and the fourth frequency.

7. The signal transmission circuit according to claim 1, further comprising a second common frequency filter configured to filter a signal centering on a second common frequency that is an anti-resonance frequency,
wherein
the first route further has the second common frequency filter connected in series between the common frequency filter and the first frequency filter,
the second route further has the second common frequency filter connected in series between the common frequency filter and the second frequency filter,
the second common frequency is equal to or higher than the common frequency, and
both the first frequency and the second frequency are equal to or higher than the second common frequency.

8. The signal transmission circuit according to claim 1, wherein the common frequency filter has a functional safety switch between the common frequency filter and one of the first and second frequency filters connected to the common frequency filter, the functional safety switch configured to detect overcurrent and a short circuit to ground and protect a power supply.

9. A signal transmission system configured to connect a camera and an ECU module by a plurality of signal wiring lines including the first signal wiring line and the second signal wiring line,
wherein
a plurality of cameras are connected to the ECU module, and
a configuration of a PoC filter configuring an inside of the ECU module has a configuration of the signal transmission circuit according to claim 1.

* * * * *